(12) United States Patent
Yamada et al.

(10) Patent No.: US 8,372,304 B2
(45) Date of Patent: Feb. 12, 2013

(54) POLISHING SLURRY

(75) Inventors: Tooru Yamada, Miyagi (JP); Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 451 days.

(21) Appl. No.: 12/457,373

(22) Filed: Jun. 9, 2009

(65) Prior Publication Data

US 2009/0311864 A1 Dec. 17, 2009

(30) Foreign Application Priority Data

Jun. 12, 2008 (JP) .................................. 2008-154437

(51) Int. Cl.
*C09K 13/00* (2006.01)
*H01L 21/44* (2006.01)

(52) U.S. Cl. ....................... 252/79.1; 438/693
(58) Field of Classification Search .................. None
See application file for complete search history.

(56) References Cited

U.S. PATENT DOCUMENTS

| | | | | |
|---|---|---|---|---|
| 4,464,193 | A * | 8/1984 | Kaneko et al. | 504/342 |
| 6,641,630 | B1 * | 11/2003 | Sun | 438/692 |
| 2003/0041526 | A1 * | 3/2003 | Fujii et al. | 252/79.1 |
| 2003/0115806 | A1 | 6/2003 | Takami et al. | |
| 2005/0031789 | A1 * | 2/2005 | Liu et al. | 427/340 |
| 2006/0081460 | A1 * | 4/2006 | Emesh et al. | 204/224 M |
| 2007/0101659 | A1 * | 5/2007 | Choung et al. | 51/307 |
| 2007/0232068 | A1 * | 10/2007 | Minamihaba et al. | 438/692 |
| 2008/0161217 | A1 * | 7/2008 | Zhang et al. | 510/176 |
| 2008/0203354 | A1 * | 8/2008 | Kamimura et al. | 252/79.1 |
| 2009/0274974 | A1 * | 11/2009 | Abdallah et al. | 430/270.1 |

FOREIGN PATENT DOCUMENTS

| | | |
|---|---|---|
| JP | 2000-84832 | 3/2000 |
| JP | 2003-17446 | 1/2003 |
| JP | 2003-142435 | 5/2003 |

* cited by examiner

*Primary Examiner* — Shamim Ahmed
*Assistant Examiner* — Bradford Gates
(74) *Attorney, Agent, or Firm* — Jean C. Edwards, Esq.; Edwards Neils PLLC

(57) ABSTRACT

A polishing slurry used in chemical mechanical polishing of a barrier layer and an interlayer dielectric film in a semiconductor integrated circuit includes an abrasive, an oxidizer, an anticorrosive, an acid, a surfactant and an inclusion compound. The polishing slurry has a pH of less than 5. The resulting polishing slurry contains a solid abrasive used in barrier CMP for polishing a barrier layer made of a metallic barrier material, has excellent storage stability, achieves a good polishing rate in various films to be polished such as the barrier layer, and is capable of independently controlling the polishing rate with respect to the various films to be polished while further suppressing agglomeration of the abrasive particles.

13 Claims, No Drawings

POLISHING SLURRY

This application claims priority to Japanese Patent Application No. 2008-154437, filed Jun. 12, 2008, the contents of which are incorporated herein by reference in their entirety. In addition, the entire contents of literatures cited in this specification are also incorporated herein by reference.

BACKGROUND OF THE INVENTION

The present invention relates to a polishing slurry that may be used in the step of manufacturing semiconductor devices. The invention more specifically relates to a polishing slurry that may be advantageously used to polish mainly a barrier layer formed from a metallic barrier material and an interlayer dielectric film in planarization carried out in the step of forming interconnections in semiconductor devices.

In the development of semiconductor devices typified by semiconductor integrated circuits (hereinafter referred to as "LSI devices"), the trend toward smaller sizes and higher processing speeds has created a need in recent years for higher density and higher integration by the adoption of miniaturization and multilayer constructions of interconnections. Various techniques are being used to this end, including chemical mechanical polishing (hereinafter referred to as "CMP"). CMP is an essential technique for carrying out, for example, the surface planarization of a film to be processed (e.g., an interlayer dielectric film), plug formation, and buried metal interconnect formation, and this technology is used to carry out substrate planarization, to remove surplus metal thin film during the formation of interconnections and to remove surplus barrier layer on the dielectric film.

CMP generally involves attaching a polishing pad onto a circular platen, impregnating the surface of the polishing pad with a polishing slurry, pressing the front side of a substrate (wafer) against the pad, and rotating both the platen and the substrate while applying a predetermined pressure (polishing pressure) from the back side of the substrate so as to planarize the front side of the substrate by the mechanical friction that arises.

In the manufacture of semiconductor devices such as LSIs, fine interconnections are formed in multiple layers, and when interconnections of metals such as copper are formed in each layer, films of barrier metals such as Ta, TaN, Ti and TiN are formed in advance in order to prevent the wiring material from diffusing to the interlayer dielectric film while improving the adhesion of the wiring material.

In order to form each interconnection layer, CMP of a metal film (hereinafter referred to as "metal film CMP") is carried out in one stage or multiple stages to remove surplus wiring material deposited by plating or other method. Then, CMP for removing metallic barrier materials (barrier metals) exposed at the surface by the metal film CMP is usually carried out. However, the metal film CMP suffers from problems such as dishing (excessive polishing of interconnection portions) and also erosion.

In order to suppress such dishing, it is required, in the barrier metal CMP following the metal film CMP, to finally form interconnection layers having reduced irregularities due to, for example, dishing and erosion by adjusting the polishing rate in the metal interconnection portions and the polishing rate in the barrier metal portions. In other words, in cases where the barrier metal and the interlayer dielectric film are polished at a relatively lower polishing rate than the metal wiring material, the interconnection portions are polished more quickly to cause dishing, resulting in erosion. It is desirable for the barrier metal and the insulating layer to be polished at a reasonably high rate in order to prevent these defects. The foregoing dishing very often occurs in the metal film CMP, and the dishing having occurred in the metal film CMP can be reduced by polishing the barrier metal and interlayer dielectric film in the barrier metal CMP at a higher polishing rate than the metal wiring material. Such a high polishing rate will bring about an increased throughput of the barrier metal CMP.

The metal polishing slurry used in CMP typically includes an abrasive (such as alumina, silica, ceric oxide or zirconia) and an oxidizer (such as hydrogen peroxide, persulfuric acid, hypochlorous acid or nitric acid). It is believed that polishing takes place with oxidization of the metal surface by the oxidizer and removal of the resulting oxide film by the abrasive.

However, CMP conducted by using such polishing slurry containing the solid abrasive is associated with the risk of scratches formed by the polishing (scratches), excessive polishing of the entire polishing surface (thinning), deformation of the polished metal surface in the shape of a dish (dishing), and excessive polishing of the insulator between metal interconnections and dish-shape deformation of a plurality of metal interconnection surfaces (erosion).

Various studies as described below have been made for such polishing slurry containing a solid abrasive.

Specifically, a CMP polishing agent and a polishing method for the purpose of polishing at a high rate while hardly causing polishing scratches (see, for example, JP 2003-17446 A), a polishing composition and a polishing method with which the cleaning property was improved in CMP (see, for example, JP 2003-142435 A), and a polishing composition for preventing polishing abrasive particles from agglomerating (see, for example, JP 2000-84832 A) have been proposed.

SUMMARY OF THE INVENTION

However, as a result of the studies the inventors had made on the foregoing polishing slurry, the conventional techniques were not necessarily satisfactory in terms of polishing the barrier layer at a higher polishing rate than the various other polishing films, independent control of the respective polishing rates and preventing the abrasive particles from agglomerating. It has also been found that these polishing slurries suffer from storage stability problems because precipitates may often form during storage. In other words, a polishing slurry fully satisfying the required performance has not actually been found yet, and further improvement has been required for the conventional polishing slurries.

An object of the present invention is to provide a polishing slurry with excellent storage stability which contains a solid abrasive used in barrier CMP for polishing a barrier layer made of a metallic barrier material, which achieves a good polishing rate in various films to be polished such as the barrier layer, and which is capable of independently controlling the polishing rate with respect to the various films to be polished while further suppressing agglomeration of the abrasive particles.

The inventors of the invention have made an intensive study to solve the foregoing problems and as a result found that these problems can be solved by the use of the polishing slurry described below. The foregoing object has been thus achieved.

(1) A polishing slurry used in chemical mechanical polishing of a barrier layer and an interlayer dielectric film in a semiconductor integrated circuit, the polishing slurry comprising: an abrasive; an oxidizer; an anticorrosive; an acid; a surfactant; and an inclusion compound, wherein the polishing slurry has a pH of less than 5.

(2) The polishing slurry according to (1) above, wherein the inclusion compound is a cyclodextrin.

(3) The polishing slurry according to (1) or (2) above, wherein the acid is a carboxyl group-containing organic acid.

(4) The polishing slurry according to any one of (1) to (3) above, wherein the acid is an organic acid containing two or more carboxyl groups.

(5) The polishing slurry according to (3) or (4) above, wherein the organic acid is a compound represented by the general formula (1):

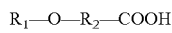
$$R_1\text{—}O\text{—}R_2\text{—}COOH \qquad \text{General formula (1)}$$

wherein $R_1$ and $R_2$ each independently represent a hydrocarbon group or an oxygen-containing hydrocarbon group, provided that $R_1$ and $R_2$ may be bonded together to form a cyclic structure.

(6) The polishing slurry according to any one of (1) to (5) above, which further comprises a di-quaternary ammonium salt.

(7) The polishing slurry according to (6) above, wherein the di-quaternary ammonium salt is an ammonium salt represented by the general formula (2):

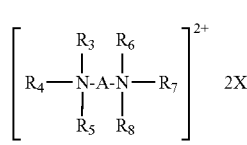

General formula (2)

wherein $R_3$ to $R_8$ each independently represent an alkyl group, an alkenyl group, a cycloalkyl group, an aryl group or an aralkyl group; two of $R_3$ to $R_8$ may be bonded together to form a ring; A represents an alkylene group, a cycloalkylene group, an arylene group or a combination thereof; $X^-$ represents an anion.

(8) The polishing slurry according to any one of (1) to (7) above, wherein the surfactant is an anionic surfactant.

(9) The polishing slurry according to any one of (2) to (8) above, wherein the cyclodextrin is β-cyclodextrin.

(10) The polishing slurry according to any one of (6) to (9) above, wherein the polishing slurry is obtained by mixing a solution A containing the abrasive, the anticorrosive, the acid and the di-quaternary ammonium salt, and a solution B containing the surfactant and the inclusion compound.

(11) A method of chemical mechanical polishing comprising the steps of: feeding the polishing slurry of any one of (1) to (10) above to a polishing pad; bringing the polishing pad into contact with a surface of an object to be polished; and polishing the surface while moving the polishing pad and the object relative to each other.

The present invention can provide a polishing slurry with excellent storage stability which contains a solid abrasive used in barrier CMP for polishing a barrier layer made of a metallic barrier material, which achieves a good polishing rate in the barrier layer, and which is capable of independently controlling the polishing rate with respect to various films to be polished while further suppressing agglomeration of the abrasive particles.

DETAILED DESCRIPTION OF THE INVENTION

Specific embodiments of the present invention are described below.

The polishing slurry according to the invention is one which is used in chemical mechanical polishing of a barrier layer and an interlayer dielectric film in a semiconductor integrated circuit, which includes an abrasive, an oxidizer, an anticorrosive, an acid, a surfactant and an inclusion compound, and which has a pH of less than 5. The polishing slurry may further contain optional ingredients.

A single substance or a combination of two or more substances may be used for each ingredient of the polishing slurry of the invention.

The "polishing slurry" as used herein encompasses not only polishing slurries actually used for polishing (i.e., optionally diluted polishing, slurries) but also polishing concentrates. The concentrates or concentrated polishing slurries refer to those prepared so as to have a higher solute concentration than at the time of use in polishing. Such slurries are diluted with water or an aqueous solution before use in polishing. In the dilution, the concentrate is typically diluted to 1 to 20 volumes. In the practice of the invention, the terms "concentration" and "concentrate" are used in the sense customarily used in the art, namely, when the solution is more "concentrated" or the solution is a "concentrate" having a higher concentration than the polishing slurry actually used in polishing. In other words, these terms are not used in the general sense involving the physical concentration procedure such as evaporation.

The respective ingredients making up the polishing slurry of the invention are described below in detail.

[Abrasive]

The polishing slurry of the invention contains an abrasive. Use may be made of abrasives commonly used in the art as exemplified by silica, alumina, ceria, titanium, manganese, zirconia, and diamond. Of these, silica, alumina and ceria may be preferably used, with silica being more preferably used in terms of reducing scratches. Silicas such as colloidal silica and fumed silica may be used depending on the intended use, and colloidal silica may be more preferably used in terms of reducing scratches.

It is preferable to use a colloidal silica which was obtained by the hydrolysis of alkoxysilane and contains no impurities such as alkali metals within the particles. On the other hand, use may also be made of a colloidal silica prepared by the method of removing the alkali from an aqueous alkali silicate solution, but in this case, the alkali metal remaining in the particles may gradually leach out to adversely affect the polishing performance. In view of this, a colloidal silica obtained by the hydrolysis of alkoxysilane is a more preferred starting material but a suitable one may be selected depending on the intended use.

The abrasive particle size is selected as appropriate for the intended use of the abrasive and is generally from about 5 nm to about 200 nm. In terms of reduced scratching, the abrasive particle size is preferably in a range of 10 to 180 nm.

The content (concentration) of the abrasive in the polishing slurry of the invention is preferably 0.05 wt % to 30 wt %, more preferably 0.1 wt % to 25 wt %, and most preferably 0.3 wt % to 25 wt % with respect to the weight of the polishing slurry used in polishing. In other words, the abrasive is incorporated in an amount of at least 0.05 wt % in terms of polishing the barrier layer at a high enough polishing rate and in an amount of not more than 30 wt % in terms of storage stability and scratch resistance.

Different abrasives may be used in combination in the polishing slurry of the invention so long as the effects of the invention are not impaired. In such a case, of all the abrasives used, colloidal silica is incorporated in an amount of preferably at least 50 wt % and most preferably at least 80 wt %. Colloidal silica may be the only abrasive incorporated in the polishing slurry.

Examples of the abrasive that may be advantageously used in combination in the polishing slurry of the invention include colloidal silica, fumed silica, ceria, alumina and titania. The size of these abrasives used in combination is preferably the same as or 0.5 to 2 times that of the colloidal silica.

[Anticorrosive]

The polishing slurry of the invention contains an anticorrosive (also referred to as "corrosion inhibitor") which adsorbs onto the polished surface to form a film thereby controlling the corrosion of the metal surface. The anticorrosive that may be used in the invention is selected from compounds for forming a passivation film on the metal surface to be polished and an example thereof includes a heterocyclic compound.

The heterocyclic compound is a compound having a heterocycle containing at least one heteroatom. The heteroatom refers to an atom other than carbon atom and hydrogen atom. The heterocycle refers to a cyclic compound having at least one heteroatom. The heteroatom only refers to an atom which forms a cyclic moiety of a heterocycle.

Examples of the heteroatom that may be preferably used include nitrogen atom, sulfur atom, oxygen atom, selenium atom, tellurium atom, phosphor atom, silicon atom and boron atom, with nitrogen atom, sulfur atom, oxygen atom and selenium atom being more preferred, nitrogen atom, sulfur atom and oxygen atom being even more preferred, and nitrogen atom and sulfur atom being most preferred.

The heterocycle serving as a scaffold is first described below.

The heterocyclic compound that may be used in the invention is not limited for the number of atoms constituting the heterocycle and may be a monocyclic compound or a polycyclic compound having fused rings. In the case of a monocyclic ring, it may preferably comprise 3 to 8 atoms, more preferably 5 to 7 atoms, and most preferably 5 to 6 atoms. In the case of a compound having fused rings, it may preferably comprise 2 to 4 rings, and more preferably 2 to 3 rings.

Specific examples of the heterocycle that may be used include, but are not limited to, pyrrole ring, thiophene ring, furan ring, pyrane ring, thiopyran ring, imidazole ring, pyrazole ring, thiazole ring, isothiazole ring, oxazole ring, isoxazole ring, pyridine ring, pyrazine ring, pyrimidine ring, pyridazine ring, pyrrolidine ring, pyrazolidine ring, imidazolidine ring, isoxazolidine ring, isothiazolidine ring, piperidine ring, piperazine ring, morpholine ring, thiomorpholine ring, chroman ring, thiochroman ring, isochroman ring, isothiochroman ring, indoline ring, isoindoline ring, pyrindine ring, indolizine ring, indole ring, indazole ring, purine ring, quinolizine ring, isoquinoline ring, quinoline ring, naphthyridine ring, phthalazine ring, quinoxaline ring, quinazoline ring, cinnoline ring, pteridine ring, acridine ring, perimidine ring, phenanthroline ring, carbazole ring, carboline ring, phenazine ring, anthyridine ring, thiadiazole ring, oxadiazole ring, triazine ring, triazole ring, tetrazole ring, benzimidazole ring, benzoxazole ring, benzothiazole ring, benzothiadiazole ring, benzofuroxan ring, naphthoimidazole ring, benzotriazole ring and tetraazaindene ring, with triazole ring and tetrazole ring being more preferred.

Next, a substituent the heterocycle may have is described.

In the practice of the invention, when called a "group", a specific moiety may not be substituted per se or may be substituted with the largest possible number of substituents of at least one type. Specifically, the alkyl group refers to a substituted or unsubstituted alkyl group.

Examples of the substitutent the heterocyclic compound may have include, but are not limited to, halogen atom (fluorine atom, chlorine atom, bromine atom, or iodine atom), alkyl group (which may be a linear, branched, or cyclic alkyl group including polycyclic alkyl group such as bicycloalkyl group, and which may contain active methine group), alkenyl group, alkynyl group, aryl group, heterocyclic group (which is not limited by the position of substitution), acyl group, alkoxycarbonyl group, aryloxycarbonyl group, heterocyclic oxycarbonyl group, carbamoyl group (which is optionally substituted as in the case of N-hydroxycarbamoyl group, N-acylcarbamoyl group, N-sulfonylcarbamoyl group, N-carbamoylcarbamoyl group, thiocarbamoyl group, or N-sulfamoylcarbamoyl group), carbazoyl group, carboxyl group or its salt, oxalyl group, oxamoyl group, cyano group, carbonimidoyl group, formyl group, hydroxy group, alkoxy group (including a group containing ethyleneoxy group or propyleneoxy group as its repeating unit), aryloxy group, heterocyclic oxy group, acyloxy group, (alkoxy or aryloxy) carbonyloxy group, carbamoyloxy group, sulfonyloxy group, amino group, (alkyl, aryl, or heterocyclic) amino group, acylamino group, sulfonamide group, ureido group, thioureido group, N-hydroxyureido group, imide group, (alkoxy or aryloxy) carbonylamino group, sulfamoylamino group, semicarbazide group, thiosemicarbazide group, hydrazino group, ammonio group, oxamoylamino group, N-(alkyl or aryl)sulfonylureido group, N-acylureido group, N-acylsulfamoylamino group, hydroxyamino group, nitro group, heterocyclic group containing quaternized nitrogen atom (for example, pyridinio group, imidazolio group, quinolinio group, or isoquinolinio group), isocyano group, imino group, mercapto group, (alkyl, aryl, or heterocyclic) thio group, (alkyl, aryl, or heterocyclic) dithio group, (alkyl or aryl)sulfonyl group, (alkyl or aryl) sulfinyl group, sulfo group or its salt, sulfamoyl group (which is optionally substituted as in the case of N-acylsulfamoyl group or N-sulfonylsulfamoyl group) or its salt, phosphino group, phosphinyl group, phosphinyloxy group, phosphinylamino group, and silyl group.

The active methine group as used herein refers to a methine group substituted with two electron withdrawing groups. Exemplary electron withdrawing groups include acyl group, alkoxycarbonyl group, aryloxycarbonyl group, carbamoyl group, alkylsulfonyl group, arylsulfonyl group, sulfamoyl group, trifluoromethyl group, cyano group, nitro group and carbonimidoyl group. The two electron withdrawing groups may be bonded together to form a cyclic structure. The salt refers to cations such as alkali metal ions, alkaline earth metal ions and heavy metal ions, and organic cations such as ammonium ion and phosphonium ion.

Examples of the substituent that may be preferably used in the heterocyclic compound include halogen atom (fluorine atom, chlorine atom, bromine atom, or iodine atom), alkyl group (which may be a linear, branched, or cyclic alkyl group including polycyclic alkyl group such as bicycloalkyl group, and which may contain active methine group), alkenyl group, alkynyl group, aryl group, heterocyclic group (which is not limited by the position of substitution), acyl group, alkoxycarbonyl group, aryloxycarbonyl group, heterocyclic oxycarbonyl group, carbamoyl group, N-hydroxycarbamoyl group, N-acylcarbamoyl group, N-sulfonylcarbamoyl group, N-carbamoylcarbamoyl group, thiocarbamoyl group, N-sulfamoylcarbamoyl group, carbazoyl group, oxalyl group, oxamoyl group, cyano group, carbonimidoyl group, formyl group, hydroxy group, alkoxy group (including a group containing ethyleneoxy group or propyleneoxy group as its repeating unit), aryloxy group, heterocyclic oxy group, acyloxy group, (alkoxy or aryloxy) carbonyloxy group, carbamoyloxy group, sulfonyloxy group, (alkyl, aryl, or heterocyclic) amino group, acylamino group, sulfonamide group, ureido group, thioureido group, N-hydroxyureido group, imide group, (alkoxy or aryloxy) carbonylamino group, sulfamoylamino group, semicarbazide group, thiosemicarbazide group, hydrazino group, ammonio group, oxamoylamino group, N-(alkyl or aryl) sulfonylureido group, N-acylureido group, N-acylsulfamoylamino group, hydroxyamino group, nitro group, heterocyclic group containing quaternized nitrogen atom (for example, pyridinio group, imidazolio group, quinolinio group, or isoquinolinio group), isocyano group, imino group, mercapto group, (alkyl, aryl, or heterocyclic) thio group, (alkyl, aryl, or heterocyclic) dithio group, (alkyl or aryl) sulfonyl group, (alkyl or aryl) sulfinyl group, sulfo group or its salt, sulfamoyl group, N-acylsulfamoyl group, N-sulfonylsulfamoyl group or its salt, phosphino group, phosphinyl group, phosphinyloxy group, phosphinylamino group, and silyl group.

The active methine group as used herein refers to a methine group substituted with two electron withdrawing groups. Exemplary electron withdrawing groups include acyl group, alkoxycarbonyl group, aryloxycarbonyl group, carbamoyl group, alkylsulfonyl group, arylsulfonyl group, sulfamoyl group, trifluoromethyl group, cyano group, nitro group and carbonimidoyl group.

Exemplary substituents that may be more preferably used include halogen atom (fluorine atom, chlorine atom, bromine atom, or iodine atom), alkyl group (which may be a linear, branched, or cyclic alkyl group including polycyclic alkyl group such as bicycloalkyl group, and which may contain active methine group), alkenyl group, alkynyl group, aryl group, and heterocyclic group (which is not limited by the position of substitution).

Two of the foregoing substituents may be bonded together to form a ring (an aromatic or nonaromatic hydrocarbon ring or an aromatic heterocycle), or be further combined to form a polycyclic fused ring. Examples of the ring that may be formed include benzene ring, naphthalene ring, anthracene ring, phenanthrene ring, fluorene ring, triphenylene ring, naphthacene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, quinolizine ring, quinoline ring, phthalazine ring, naphthyridine ring, quinoxaline ring, quinoxazoline ring, isoquinoline ring, carbazole ring, phenanthridine ring, acridine ring, phenanthroline ring, thianthrene ring, chromene ring, xanthene ring, phenoxathiine ring, phenothiazine ring, and phenazine ring.

Specific examples of the heterocyclic compound include, but are not limited to, 1,2,3,4-tetrazole, 5-amino-1,2,3,4-tetrazole, 5-methyl-1,2,3,4-tetrazole, 1H-tetrazole-5-acetic acid, 1H-tetrazole-5-succinic acid, 1,2,3-triazole, 4-amino-1,2,3-triazole, 4,5-diamino-1,2,3-triazole, 4-carboxy-1H-1,2,3-triazole, 4,5-dicarboxy-1H-1,2,3-triazole, 1H-1,2,3-triazole-4-acetic acid, 4-carboxy-5-carboxymethyl-1H-1,2,3-triazole, 1,2,4-triazole, 3-amino-1,2,4-triazole, 3,5-diamino-1,2,4-triazole, 3-carboxy-1,2,4-triazole, 3,5-dicarboxy-1,2,4-triazole, 1,2,4-triazole-3-acetic acid, 1H-benzotriazole, 1H-benzotriazole-5-carboxylic acid, benzotriazole, 1,2,3-benzotriazole, 5,6-dimethyl-1,2,3-benzotriazole, 1-(1,2-dicarboxyethyl)benzotriazole, 1-[N,N-bis(hydroxyethyl)aminomethyl]benzotriazole, and 1-(hydroxymethyl)benzotriazole. Of these, the heterocyclic compound is more preferably selected from among 1,2,3-benzotriazole, 5,6-dimethyl-1,2,3-benzotriazole, 1-(1,2-dicarboxyethyl)benzotriazole, 1-[N,N-bis(hydroxyethyl)aminomethyl]benzotriazole, and 1-(hydroxymethyl)benzotriazole.

These anticorrosives may be used alone or in combination of two or more.

The heterocyclic compound is preferably incorporated in the polishing slurry of the invention in a total amount of 0.0001 to 1.5 mol, more preferably 0.0005 to 1.0 mol and even more preferably 0.0005 to 0.8 mol per liter of the polishing slurry at the time of use in polishing (i.e., diluted polishing slurry in the case of diluting with water or an aqueous solution). Within the above-defined range, a better polishing rate is achieved while further suppressing scratches.

[Acid]

The polishing slurry of the invention contains an acid. Inorganic acids or organic acids may be used depending on the purpose and combination use of these acids is also possible. In the practice of the invention, a carboxyl group-containing organic acid may be preferably used. The carboxyl group-containing organic acid is used without particular limitation as long as it is a compound containing at least one carboxyl group in the molecule, and examples thereof include amino acids such as glycine and α-alanine. In terms of improving the polishing rate, it is preferable to select a compound represented by the general formula (1):

$$R_1\text{—}O\text{—}R_2\text{—}COOH \qquad \text{General formula (1)}$$

wherein $R_1$ and $R_2$ each independently represent a hydrocarbon group or an oxygen-containing hydrocarbon group; $R_1$ and $R_2$ may be bonded together to form a cyclic structure.

The number of carboxyl groups in the molecule is preferably from 1 to 4, and more preferably from 1 to 2 because they can be used at a low cost.

In the general formula (1), $R_1$ represents a monovalent hydrocarbon group or oxygen-containing hydrocarbon group. Examples of such hydrocarbon group and oxygen-containing hydrocarbon group that may be preferably used include alkyl groups having 1 to 10 carbon atoms such as methyl group and cycloalkyl group; aryl groups such as phenyl group; alkoxy groups such as methoxy group and ethoxy group; and aryloxy groups.

In the general formula (1), $R_2$ represents a divalent hydrocarbon group or oxygen-containing hydrocarbon group. Examples of such hydrocarbon group and oxygen-containing hydrocarbon group include alkylene groups having 1 to 10 carbon atoms such as methylene group and cycloalkylene group; arylene groups such as phenylene group; and alkyleneoxy groups.

The hydrocarbon group or oxygen-containing hydrocarbon group represented by $R_1$ and $R_2$ may have a substituent. Examples of the substituent that can be introduced include alkyl groups having 1 to 3 carbon atoms, aryl groups, alkoxy groups and carboxyl group. In cases where the hydrocarbon group or oxygen-containing hydrocarbon group is substituted with a carboxyl group, this compound has a plurality of carboxyl groups.

$R_1$ and $R_2$ may be bonded together to form a cyclic structure. There is no particular limitation on the cyclic structure formed. The cyclic structure may be aromatic or nonaromatic, and is preferably a cyclic hydrocarbon.

Examples of the compound represented by the general formula (1) include 2-furancarboxylic acid, 2,5-furandicarboxylic acid, 3-furancarboxylic acid, 2-tetrahydrofurancarboxylic acid, diglycolic acid, methoxyacetic acid, methoxyphenylacetic acid, and phenoxyacetic acid. Of these, 2,5-furandicarboxylic acid, 2-tetrahydrofurancarboxylic acid, diglycolic acid, methoxyacetic acid, and phenoxyacetic acid are preferable in terms of polishing the object surface at a high speed.

In a preferred embodiment, the carboxyl group-containing compound includes a compound having at least two carboxyl groups in the molecule. The number of carboxyl groups in the molecule is preferably from 2 to 4, and more preferably 2 because they can be used at a low cost. Examples of the carboxyl group-containing compound include salicylic acid, oxalic acid, malonic acid, succinic acid, adipic acid, pimelic acid, maleic acid, phthalic acid, malic acid, tartaric acid, and polyacrylic acid.

The acid (preferably the compound represented by the general formula (1)) is incorporated in the polishing slurry of the invention in an amount of preferably 0.01 wt % to 10 wt % and more preferably 0.1 wt % to 5 wt % with respect to the weight of the polishing slurry at the time of use in polishing. In other words, the acid content is preferably at least 0.01 wt % in terms of achieving a high enough polishing rate and preferably up to 10 wt % in terms of preventing excessive dishing from occurring.

[Surfactant]

The surfactant used in the invention may be any of a cationic surfactant, an nonionic surfactant and an anionic surfactant, but an anionic surfactant (especially an acid anionic surfactant) or a cationic surfactant is preferably used. By adjusting the type and amount of surfactant used, the polishing rate can be improved while controlling the polishing rate in the insulating layer. Exemplary salts include ammonium salts, potassium salts and sodium salts, with sodium salts, ammonium salts and potassium salts being particularly preferred. Salts selected from the following group are advantageously used.

Examples of the anionic surfactant include carboxylic acids and their salts, sulfonic acids and their salts, sulfate salts, and phosphate salts. Examples of the carboxylic acids and their salts include soaps, N-acylamino acids and their salts, polyoxyethylene or polyoxypropylene alkyl ether carboxylic acids and their salts, and acylated peptides. Examples of the sulfonic acids and their salts include alkylsulfonic acids and their salts, alkylbenzene or alkylnaphthalenesulfonic acids and their salts, naphthalenesulfonic acids and their salts, sulfosuccinic acids and their salts, α-olefin sulfonic acids and their salts, and N-acylsulfonic acids and their salts. Examples of the sulfate salts include sulfonated oils, alkylsulfuric acids and their salts, alkyl ether sulfuric acids and their salts, polyoxyethylene or polyoxypropylene alkyl allyl ether sulfuric acids and their salts, and alkylamide sulfuric acids and their salts. Examples of the phosphate salts include alkylphosphoric acids and their salts, and polyoxyethylene or polyoxypropylene alkyl allyl ether phosphoric acids and their salts. Of these, sulfonic acids and their salts are preferably used.

Furthermore, in terms of improving the polishing rate in the insulating layer, the surfactant that may be used in a preferred embodiment of the invention is a compound represented by the general formula (3):

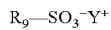$—SO_3^-Y^+$  General formula (3)

wherein $R_9$ represents a hydrocarbon group and $Y^+$ represents a cation. In terms of reducing the polishing rate in the insulating layer, the surfactant is preferably one having an alkyl group and/or an aryl group, and more preferably one represented by the general formula (3).

$R_9$ represents a hydrocarbon group, examples of which include alkyl groups (preferably having 6 to 20 carbon atoms), aryl groups such as phenyl group and naphthyl group, and alkylaryl groups (with the alkyl moiety preferably having 6 to 20 carbon atoms). These groups may further have a substituent such as an alkyl group.

$Y^+$ represents a cation. Preferred examples of the cation include hydrogen ion, alkali metal ions, polyatomic ions such as quaternary ammonium ion, oxonium ion and ammonium ion, monoatomic metal ions such as silver ion and copper (I) ion, and complex ions such as diamminesilver ion and violeo. Of these, hydrogen ion, alkali metal ions, and polyatomic ions such as quaternary ammonium ion, oxonium ion and ammonium ion are more preferred.

Illustrative examples of the surfactant represented by the general formula (3) include decylbenzenesulfonic acid, dodecylbenzenesulfonic acid, tetradecylbenzenesulfonic acid, hexadecylbenzenesulfonic acid, dodecylnaphthalenesulfonic acid, and tetradecylnaphthalenesulfonic acid.

In a preferred embodiment, the cationic surfactant is one represented by the general formula (4):

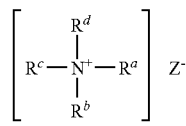  General formula (4)

wherein $R^a$ to $R^d$ each independently represent a hydrocarbon group, provided that $R^a$ to $R^d$ do not represent the same hydrocarbon group. $Z^-$ represents an anion.

$R^a$ to $R^d$ each independently represent a hydrocarbon group. Specific examples of $R^a$ to $R^d$ include alkyl groups and aryl groups such as phenyl group, with linear and branched alkyl groups having 1 to 20 carbon groups being preferably used.

Two of $R^a$ to $R^d$ may be bonded together to form a cyclic structure such as pyridine structure, pyrrolidine structure, piperidine structure or pyrrole structure.

$Z^-$ represents an anion. Specific examples thereof include hydroxide ion, halide ions (fluorine ion, chlorine ion, bromine ion, iodine ion), nitrate ion, sulfate ion, phosphate ion, hydrocarbon ion, nitrite ion, sulfonate ion, acetate ion, dihydrogen phosphate ion, carbonate ion, thiosulfate ion, oxide ion, sulfide ion, peroxide ion, monohydrogen phosphate ion, permanganate ion, hypochlorite ion, tetrachlorocuprate (II) ion, and p-toluenesulfonate ion.

Specific examples of the surfactant represented by the general formula (4) include compounds such as lauryltrimethylammonium, lauryltriethylammonium, stearyltrimethylammonium, palmityltrimethylammonium, octyltrimethylammonium, dodecylpyridinium, decylpyridinium, and octylpyridinium.

Surfactants other than represented by the general formula (3) or (4) may be used for the surfactant of the invention. Exemplary anionic surfactants other than represented by the general formula (3) include carboxylate salts, sulfate salts, and phosphate salts.

More specifically, use may be preferably made of carboxylate salts including soaps, N-acylamino acid salts, polyoxyethylene or polyoxypropylene alkyl ether carboxylic acid salts, and acylated peptides;

sulfate salts including sulfonated oils, alkylsulfuric acid salts, alkyl ether sulfuric acid salts, polyoxyethylene or polyoxypropylene alkyl allyl ether sulfuric acid salts, and alkylamide sulfuric acid salts; and phosphate salts including alkylphosphoric acid salts, and polyoxyethylene or polyoxypropylene alkyl ether phosphoric acid salts.

Examples of the cationic surfactant include the surfactants represented by the general formula (4) as well as aliphatic amine salts, aliphatic quaternary ammonium salts, benzalkonium chloride salts, benzethonium chloride, pyridinium salts, and imidazolinium salts. Examples of the amphoteric surfactant include carboxybetaine surfactants, sulfobetaine surfactants, aminocarboxylate salts, imidazolinium betaines, lecithins, and alkylamine oxides.

Examples of the nonionic surfactant include ether surfactants, ether ester surfactants, ester surfactants, and nitrogen-containing surfactants. Exemplary ether surfactants include polyoxyethylene alkyl and alkyl phenyl ethers, alkylallyl formaldehyde condensed polyoxyethylene ethers, polyoxyethylene/polyoxypropylene block polymers, and polyoxyethylene polyoxypropylene alkyl ethers. Exemplary ether ester surfactants include polyoxyethylene ethers of glycerol esters, polyoxyethylene ethers of sorbitan esters, and polyoxyethylene ethers of sorbitol esters. Exemplary ester surfactants include polyethylene glycol fatty acid esters, glycerol esters, polyglycerol esters, sorbitan esters, propylene glycol esters, and sucrose esters. Exemplary nitrogen-containing surfactants include fatty acid alkanolamides, polyoxyethylene fatty acid amides, and polyoxyethylene alkylamides.

Other exemplary surfactants that may be used in the invention include fluorosurfactants. The surfactants may be used alone or in combination of two or more, and different types of surfactants may be used in combination.

The surfactant is preferably incorporated in the polishing slurry of the invention in a total amount of $1 \times 10^{-6}$ wt % to 5 wt %, more preferably $1 \times 10^{-6}$ wt % to 3 wt %, and even more preferably $1 \times 10^{-6}$ wt % to 2.5 wt % with respect to the polishing slurry at the time of use in polishing. Within the above-defined range, a better polishing rate is achieved while further suppressing scratches.

[Inclusion Compound]

The polishing slurry of the invention contains an inclusion compound in terms of improved polishing rate and storage stability. The "inclusion compound" as used herein is defined as a compound which identifies other ions, atoms or molecules and traps them by various interactions in cavities formed within molecules or molecular aggregates.

Examples of such inclusion compound include cyclodextrins, cyclophanes, neutral polyligands, cyclic polyanions, cyclic polycations, and cyclic peptides. Cyclodextrins are preferably used in the invention in terms of further improved storage stability.

Cyclodextrin is a cyclic oligosaccharide having a cyclic structure in which several D-glucose molecules are linked by glucosidic linkage. At least 5 glucoses are linked together in a known type of cyclodextrin and 6 to 8 glucoses are linked together in a common type of cyclodextrin. One having 6 glucoses linked together, one having 7 glucoses linked together, and one having 8 glucoses linked together are called α-cyclodextrin, β-cyclodextrin and γ-cyclodextrin, respectively. Of these, β-cyclodextrin is more preferred because it is available at a relatively low cost.

The inclusion compound need only be contained in the polishing slurry but is preferably added to the polishing slurry before addition of the surfactant in terms of the storage stability. Alternatively, a mixed solution containing a surfactant and an inclusion compound may be separately prepared and be then added to the polishing slurry containing other ingredients such as an abrasive. It is also possible to change the polishing rate as desired by separately preparing a mixed solution containing a surfactant and an inclusion compound and a solution containing other ingredients and mixing them at an arbitrary ratio just before use.

In terms of the storage stability and polishing rate, the inclusion compound is preferably incorporated in the polishing slurry of the invention in an amount of $1 \times 10^{-7}$ wt % to 20 wt %, more preferably $1 \times 10^{-7}$ wt % to 15 wt %, and even more preferably $1 \times 10^{-7}$ wt % to 10 wt %.

The content of the inclusion compound may also be determined taking the balance with the surfactant into account and be determined in a range of 0.01 mol to 50 mol, preferably 0.01 mol to 40 mol and more preferably 0.01 mol to 30 mol per molar of the surfactant.

[Di-quaternary Ammonium Salt]

The polishing slurry of the invention may contain a di-quaternary ammonium salt (hereinafter often referred to simply as "specific cation salt").

The di-quaternary ammonium salt of the invention is not particularly limited as long as it has a chemical structure containing two quaternary nitrogen atoms. In terms of significantly improving the polishing rate, the di-quaternary ammonium salt is preferably an ammonium salt represented by the general formula (2):

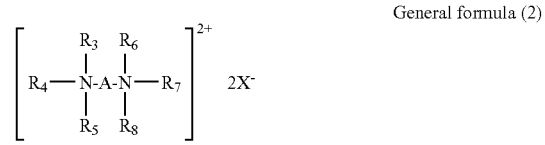

General formula (2)

wherein $R_3$ to $R_8$ each independently represent an alkyl group, an alkenyl group, a cycloalkyl group, an aryl group or an aralkyl group. Two of $R_3$ to $R_8$ may be bonded together to form a ring. A represents an alkylene group, a cycloalkylene group, an arylene group or a combination thereof. $X^-$ represents an anion.

$R_3$ to $R_8$ each independently represent an alkyl group, an alkenyl group, a cycloalkyl group, an aryl group or an aralkyl group. Examples of the alkyl group include ones having 1 to 20 carbon atoms such as methyl group, ethyl group, propyl group, butyl group, pentyl group, hexyl group, heptyl group, and octyl group. Of these, methyl group, ethyl group, propyl group and butyl group are preferred.

Examples of the alkenyl group that may be preferably used include ones having 2 to 10 carbon groups such as ethynyl group, propyl group, butynyl group, pentynyl group and hexynyl group. Specific examples of the cycloalkyl group include cyclohexyl group and cyclopentyl group. Of these, cyclohexyl group is preferred. Specific examples of the aryl group include phenyl group and naphthyl group. Of these, phenyl group is preferred. A specific example of the aralkyl group includes benzyl group.

The groups described above may further have a substituent. Examples of the substituent that may be introduced include hydroxyl group, amino group, carboxyl group, phosphate group, imino group, thiol group, sulfo group and nitro group.

A in the general formula (2) represents an alkylene group, an alkenylene group, a cycloalkylene group, an arylene group or a combination of two or more thereof. In addition to the above-described organic linking groups, the linking group represented by A may also contain —S—, —S(=O)$_2$—, —O—, or —C(=O)— in the chain.

Examples of the alkylene group include ones having 1 to 10 carbon atoms such as methylene group, ethylene group, propylene group, butylene group, pentylene group, hexylene group, heptylene group, and octylene group. Of these, ethylene group and pentylene group are preferred. Specific examples of the alkenylene group include ethynylene group and propynylene group. Of these, propynylene group is preferred. Specific examples of the cycloalkylene group include cyclohexylene group and cyclopentylene group. Of these, cyclohexylene group is preferred. Specific examples of the arylene group include phenylene group and naphthylene group. Of these, phenylene group is preferred.

The linking groups described above may further have a substituent. Examples of the substituent that may be introduced include hydroxyl group, amino group, carboxyl group, phosphate group, imino group, thiol group, sulfo group and nitro group.

$X^-$ represents an anion. Specific examples thereof include hydroxide ion, halide ions (fluorine ion, chlorine ion, bromine ion, iodine ion), nitrate ion, sulfate ion, phosphate ion, hydrocarbon ion, nitrite ion, sulfonate ion, acetate ion, dihydrogen phosphate ion, carbonate ion, thiosulfate ion, oxide ion, sulfide ion, peroxide ion, monohydrogen phosphate ion, permanganate ion, hypochlorite ion, tetrachlorocuprate (II) ion, and p-toluenesulfonate ion.

Specific examples of the di-quaternary ammonium cation moiety (specific cation) in the di-quaternary ammonium salt of the invention (di-quaternary cations A-1 to A-32) are illustrated below, but the invention should not be construed as being limited to the these examples.

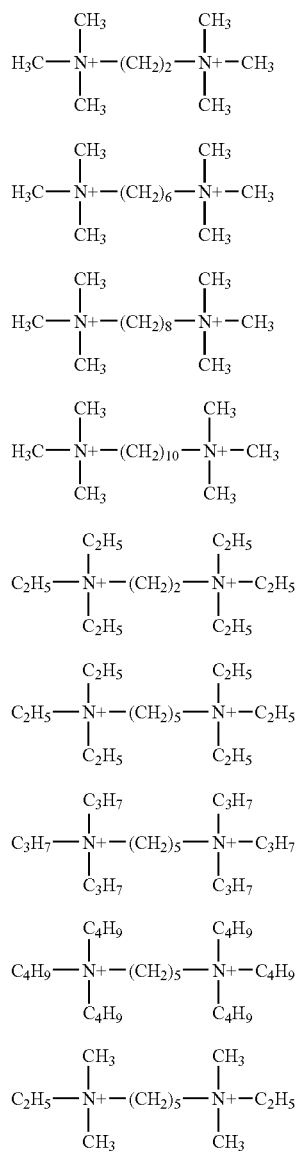

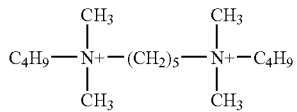

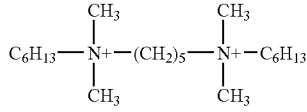

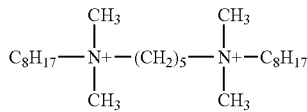

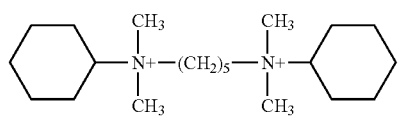

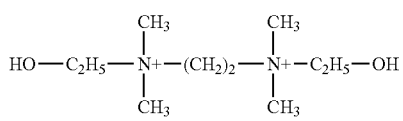

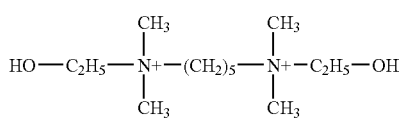

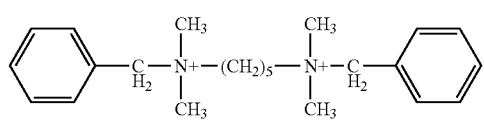

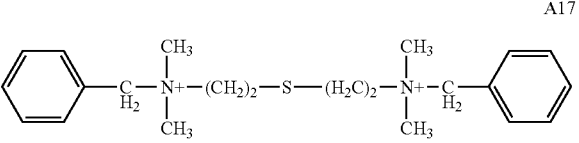

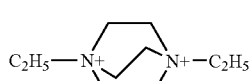

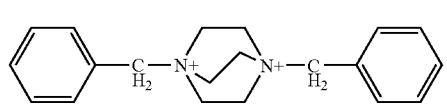

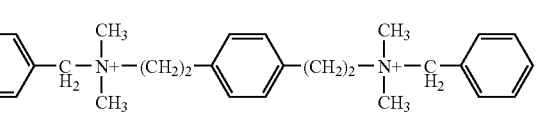

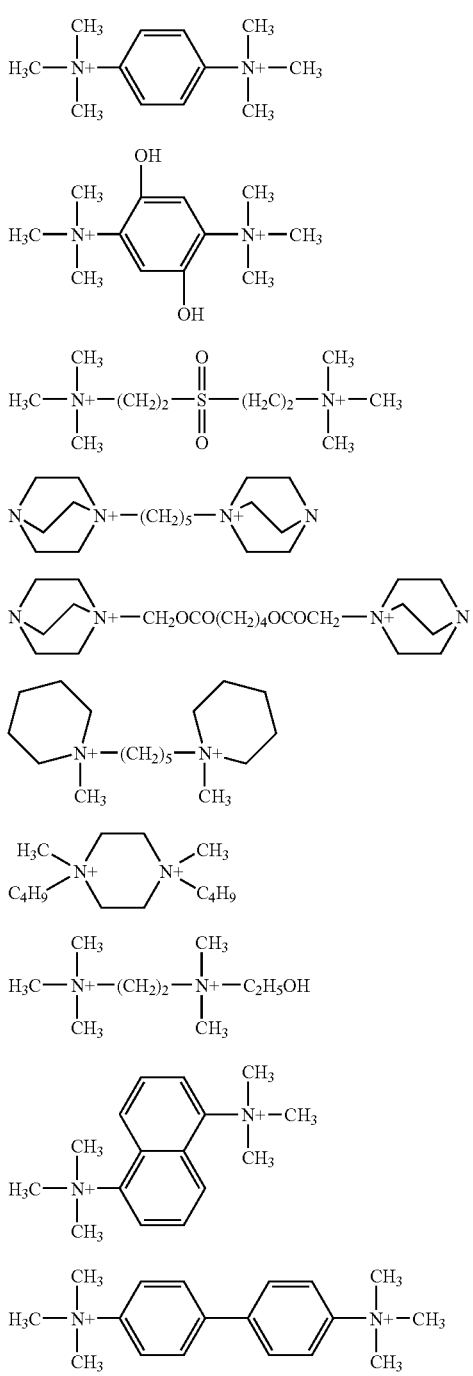

Of the foregoing di-quaternary ammonium cations (specific cations), A1, A2, A3, A4, A5, A6, A7, A8, A9, A10, A11, A12, A13, A14, A15, A18, A19, A23, A24, A29, A30, A31, and A32 are preferred in terms of the dispersion stability in the slurry. As described above, exemplary counter anions (anions) of the di-quaternary ammonium cations include hydroxide ion, halide ions, nitrate ion, sulfate ion, phosphate ion, hydrocarbon ion, nitrite ion, sulfonate ion, acetate ion, dihydrogen phosphate ion, carbonate ion, thiosulfate ion, oxide ion, sulfide ion, peroxide ion, monohydrogen phosphate ion, permanganate ion, hypochlorite ion, tetrachlorocuprate (II) ion, and p-toluenesulfonate ion.

The di-quaternary ammonium salt (specific cation salt) in the invention can be synthesized by, for example, a substitution reaction in which ammonia or any of various amines serves as the nucleophile. The di-quaternary ammonium salt can also be purchased as a commercially available reagent.

The di-quaternary ammonium salt (specific cation salt) in the invention is preferably incorporated in an amount of 0.0001 wt % to 5 wt % and more preferably 0.001 wt % to 3 wt % with respect to the polishing slurry at the time of use in polishing (i.e., diluted polishing slurry in the case of diluting with water or an aqueous solution; the "polishing slurry at the time of use in polishing" to be described later has the same meaning). In other words, the di-quaternary ammonium salt content is preferably at least 0.0001 wt % in terms of significantly improving the polishing rate and preferably up to 5 wt % in terms of sufficiently high slurry stability.

[Oxidizer]

The polishing slurry of the invention contains a compound which is capable of oxidizing the metal to be polished (oxidizer).

Illustrative examples of the oxidizer include hydrogen peroxide, peroxides, nitrates, iodates, periodates, hypochlorites, chlorites, chlorates, perchlorates, persulfates, bichromates, permanganates, ozonated water, silver (II) salts, and iron (III) salts. Of these, hydrogen peroxide is preferably used.

Preferred exemplary iron (III) salts include inorganic iron (III) salts such as iron (III) nitrate, iron (III) chloride, iron (III) sulfate and iron (III) bromide, and also organic complex salts of iron (III).

The content of the oxidizer can be adjusted by the initial dishing amount in the barrier CMP. In cases where the initial dishing amount in the barrier CMP is large, in other words, the wiring material is not to be polished so much in the barrier CMP, the oxidizer is desirably used in a smaller amount. In cases where the dishing amount is sufficiently small to polish the wiring material at a high speed, the oxidizer is desirably added in a larger amount. Since it is thus desirable to change the content of the oxidizer depending on the initial dishing state in the barrier CMP, the oxidizer is preferably incorporated in the polishing slurry in an amount of 0.001 to 3 mol and more preferably 0.005 to 2 mol per liter of the polishing slurry at the time of use in polishing.

In addition to the foregoing components, the polishing slurry of the invention may also contain optional ingredients described below.

[pH Adjuster]

The polishing slurry of the invention should have a pH of less than 5 and preferably has a pH of 2.0 to 4.5. The polishing rates of the barrier layer and the interlayer dielectric film can be more efficiently adjusted by controlling the pH of the polishing slurry in the above-defined range.

An alkali/acid or a buffering agent is used to adjust the pH within the above-defined preferable range. The polishing slurry of the invention exhibits particularly outstanding effects at a pH within the above-defined range.

Examples of the alkali/acid and the buffering agent include nonmetallic alkaline agents such as ammonia, ammonium hydroxide, organic ammonium hydroxides (e.g., tetramethylammonium hydroxide), and alkanolamines (e.g., diethanolamine, triethanolamine, and triisopropanol amine); alkali metal hydroxides such as sodium hydroxide, potassium hydroxide, and lithium hydroxide; inorganic acids such as nitric acid, sulfuric acid and phosphoric acid; carbonates such as sodium carbonate; phosphates such as trisodium phosphate; borates; tetraborates; and hydroxybenzoates. Ammonium hydroxide, potassium hydroxide, lithium hydroxide, and tetramethylammonium hydroxide are particularly preferred alkalis.

The alkali/acid or buffering agent should be added in such an amount that the pH is maintained in a preferable range, and the content is preferably from 0.0001 to 2.0 mol, and more preferably from 0.003 to 1 mol, per liter of the polishing slurry at the time of use in polishing.

[Chelating Agent]

It is preferable for the polishing slurry of the invention to optionally contain a chelating agent (i.e. water softener) to reduce an adverse effect of polyvalent metal ion contaminants. Illustrative examples of the chelating agent include general-purpose water softeners (agents for preventing precipitation of calcium and magnesium) and their analogous compounds such as nitrilotriacetic acid, diethylenetriaminepentaacetic acid, ethylenediaminetetraacetic acid, N,N,N-trimethylenephosphonic acid, ethylenediamine-N,N,N',N'-tetramethylenesulfonic acid, transcyclohexanediaminetetraacetic acid, 1,2-diaminopropanetetraacetic acid, glycol ether diamine tetraacetic acid, ethylenediamine-ortho-hydroxyphenylacetic acid, ethylenediaminedisuccinic acid (SS form), N-(2-carboxylate ethyl)-L-aspartic acid, β-alaninediacetic acid, 2-phosphonobutane-1,2,4-tricarboxylic acid, l-hydroxyethylidene-1,1-diphosphonic acid, N,N'-bis(2-hydroxybenzyl) ethylenediamine-N,N'-diacetic acid and 1,2-dihydroxybenzene-4,6-disulfonic acid. The chelating agents may optionally be used in combination of two or more.

The chelating agent may be used in a sufficient amount to sequester the contaminants including metal ions such as polyvalent metal ions. For example, the chelating agent is preferably incorporated in an amount of 0.0001 to 0.1 mol per liter of the polishing slurry actually used for polishing.

The polishing slurry of the invention is not particularly limited for its production method. For example, the polishing slurry of the invention can be produced by thoroughly mixing an abrasive, an oxidizer, an anticorrosive, an acid, a surfactant, an inclusion compound, additives and water using an agitator such as a mixer. Exemplary methods that may be used include a method in which the ingredients are mixed after adjusting them to a preset pH and a method in which the ingredients are mixed before adjusting them to a preset pH. Use may also be made of a method in which a concentrate containing the foregoing compound is produced and diluted before use to adjust the concentration to a predetermined value.

In a preferred embodiment of the production method, the polishing slurry may also be produced by separately preparing Solution (A) containing an abrasive, an anticorrosive, an acid, a di-quaternary ammonium salt and Solution (B) containing a surfactant and an inclusion compound and mixing Solutions (A) and (B) at an arbitrary ratio.

The polishing slurry of the invention is usually suitable for use in chemical mechanical polishing of an interlayer dielectric film and a barrier layer which is present between an interconnection made of copper metal and/or a copper alloy and the interlayer dielectric film on a semiconductor integrated circuit substrate and which is made of a metallic barrier material for preventing diffusion of metals such as copper. Usually in the semiconductor device manufacturing process, an interlayer dielectric film with a low dielectric constant is covered with a barrier layer, on which a metal interconnection film is formed by metal plating; the metal interconnection film is then polished with a metal polishing slurry in the chemical mechanical polishing step, which is followed by polishing of the barrier layer and the interlayer dielectric film.

The polishing slurry of the invention is preferably used in this process. This process preferably includes a rinsing step which is carried out after polishing of the metal interconnection but before polishing of the barrier layer.

[Metallic Barrier Material]

Exemplary materials making up the barrier layer to be polished with the polishing slurry of the invention include low-resistance metallic materials such as TiN, TiW, Ta, TaN, W and WN. Of these, Ta and TaN are particularly preferable.

[Interlayer Dielectric Film]

Examples of the interlayer dielectric film to be polished with the polishing slurry of the invention include conventionally used ones made of, for example, TEOS (tetraethoxysilane) and ones made of materials having a dielectric constant as low as about 3.5 to about 2.0 (e.g., organic polymers and SiOC and SiOF materials). These films are usually referred to as "low-k films".

More specifically, SiOC materials such as HSG-R7 (available from Hitachi Chemical Co., Ltd.) and BLACKDIAMOND (Applied Materials, Inc.) are used to form low-k interlayer dielectric films.

[Metal Wiring Material]

In the practice of the invention, the object to be polished preferably has interconnections made of copper metal and/or a copper alloy as applied to semiconductor devices such as LSI. Copper alloys are particularly preferable starting materials for the interconnections. A copper alloy containing silver is preferably selected from among the copper alloys.

The copper alloy preferably contains silver in an amount of not more than 40 wt %, more preferably not more than 10 wt % and even more preferably not more than 1 wt %. The copper alloy containing silver in an amount of 0.00001 to 0.1 wt % exhibits the most significant effects.

[Width of Interconnects]

When applied to, for example, dynamic random access memory (DRAM) devices, the object to be polished in the invention preferably has interconnections with a half pitch of up to 0.15 μm, more preferably up to 0.10 μm, and even more preferably up to 0.08 μm.

When applied to, for example, microprocessing unit (MPU) devices, the object to be polished preferably has interconnections with a half pitch of up to 0.12 μm, more preferably up to 0.09 μm, and even more preferably up to 0.07 μm.

The polishing slurry used in the invention exhibits particularly outstanding effects on those having such interconnections.

[Polishing Method]

The polishing slurry of the invention may be prepared as a concentrate which is diluted with water or an aqueous solution before use to form a working slurry (1); or prepared by furnishing various ingredients in the form of the aqueous solutions described later, mixing the solutions and diluting the mixture with water as needed to thereby form a working slurry (2); or again, prepared as a working slurry itself (3). Any of the foregoing polishing slurries may be applied to the polishing method using the polishing slurry of the invention. The polishing method (method of chemical mechanical polishing) is a method which involves feeding the polishing slurry to a polishing pad on a polishing platen and moving the polishing pad and an object surface to be polished relative to each other with the polishing pad in contact with the object surface.

An ordinary polisher having a holder which holds the object having a surface to be polished (e.g., a wafer having a film of a conductive material formed thereon) and a polishing platen (provided with a motor whose number of revolution is variable or the like) onto which a polishing pad is attached may be used as the apparatus employed for polishing. The polishing pad is not subject to any particular limitation, and may be made of, for example, a common nonwoven fabric, expanded polyurethane, or porous fluorocarbon resin. No particular limitation is imposed on the polishing conditions, although to keep the object from flying off the platen, it is preferable for the rotation speed of the platen to be 200 rpm or less. The pressure with which the object having the surface to be polished (film to be polished) is pressed against the polishing pad is preferably from 0.68 to 34.5 KPa. To achieve satisfactory uniformity of the polishing rate across the object and adequate pattern planarity, a pressure of 3.40 to 20.7 KPa is more preferred.

During polishing, it is preferable to continuously feed the polishing slurry by means of a pump or the like to the polishing pad.

After the end of polishing, the polished object is thoroughly washed with running water, following which water drops adhering to the polished object are dislodged using a spin dryer or the like, and the object is dried.

When a concentrate is diluted in the invention as in the method (1) above, the aqueous solution as described below can be used. The aqueous solution is water in which at least one of oxidizers, acids, additives and surfactants is incorporated in advance, and the sum of the ingredients in the aqueous solution and the ingredients in the concentrate to be diluted makes up the total ingredients of the polishing slurry for use in polishing (working slurry).

When a concentrated slurry is used after dilution with an aqueous solution in this way, difficult-to-dissolve ingredients can be blended later in the form of an aqueous solution, which makes it possible to prepare a slurry that is more highly concentrated.

Methods for diluting a concentrated slurry with water or an aqueous solution include a method in which a line that feeds a concentrated polishing slurry and a line that feeds water or an aqueous solution are joined together at some intermediate point so that the respective fluids may be mixed, with the resulting polishing slurry dilution being fed to the polishing pad as a working slurry. Mixing of the concentrated slurry and the water or aqueous solution may be carried out by conventional methods including a method that involves causing the two fluids to run under pressure through narrow passages so that the fluids may collide and mix with each other; a method in which a material such as glass tubing is packed in a pipe so as to make the flow of liquid split and confluent repeatedly; or a method that provides blades within a pipe which are powered to rotate.

One example of a method in which polishing is carried out while a concentrated slurry is diluted with water or an aqueous solution is a process which independently provides a line that feeds a polishing slurry and a line that feeds water or an aqueous solution, feeds a predetermined amount of fluid from each line to the polishing pad, and carries out mixing of the two fluids and polishing at a time by moving the polishing pad and the surface to be polished relative to each other. In another process which may be used, predetermined amounts of concentrated polishing slurry and of water or an aqueous solution are added to a single vessel and mixed, and the slurry after such mixing is fed to the polishing pad to carry out polishing.

In another polishing method, the ingredients to be contained in the polishing slurry are separated into at least two components. At the time of their use, the two or more components are diluted with water or an aqueous solution and fed to the polishing pad on the polishing platen, and polishing is carried out while moving the surface to be polished and the polishing pad relative to each other with the polishing pad in contact with the surface.

For example, Component (A) containing an abrasive, an oxidizer, an anticorrosive, an acid and an optionally added di-quaternary ammonium salt and Component (B) containing a surfactant and an inclusion compound may be prepared in advance and used after dilution with water or an aqueous solution.

In the above example, three lines are required to separately feed Component (A), Component (B), and the water or aqueous solution. Mixing for dilution may be carried out by a method in which the three lines are coupled to a single line for feeding to the polishing pad so that mixing is realized in the latter line. In this case, an alternative possibility is to join together two of the three lines, then later join the third line. In this method, the component containing difficult-to-dissolve additives and the other component are initially mixed in a long passage so as to ensure a sufficient dissolution time, following which water or an aqueous solution is added from its feeding line joined downstream of the mixing passage.

Other exemplary mixing methods include, similar to the above, a method where the three lines are each directly brought to the polishing pad and mixing is achieved by the movement of the polishing pad and the surface to be polished relative to each other, and a method where the three components as above are mixed in a single vessel, from which the diluted polishing slurry is fed to the polishing pad.

In the polishing method as described above, an alternative procedure is the one in which one component including the oxidizer is kept at a temperature of up to 40° C. while heating other components to a temperature in a range of room temperature to 100° C., and the temperature is adjusted to not more than 40° C. by the mixing of the one component and other components, or in the subsequent dilution of the mixture with water or an aqueous solution. This method makes use of the increase in solubility at a higher temperature, and is advantageous in order to increase the solubility of low-solubility materials for the polishing slurry.

Because the materials which have been dissolved by warming the other components above to a temperature in a range from room temperature to 100° C. precipitate out of solution when the temperature falls, in cases where the other components are in a low-temperature state at the time of use, the precipitated materials must be dissolved by pre-warming the components. This can be done by employing a means which warms the other components, then delivers the components in which the materials have been dissolved, or a means which agitates then delivers each of the precipitate-containing liquids, and warms the line for feeding the relevant component to effect dissolution. If the oxidizer-containing component is heated to 40° C. or higher, there is a risk that the oxidizer will decompose. Hence, when the other components which have been warmed and the oxidizer-containing component are mixed, it is preferable to have the temperature of the mixture be no higher than 40° C.

In the practice of the invention, the polishing slurry may thus be fed to the surface to be polished in the form of two or more separate components. In this case, it is preferable to feed the ingredients separated into the component including the oxidizer and the component including the acid (e.g., organic acid). It is also possible to prepare the polishing slurry as a concentrate and feed it to the surface to be polished separately from the diluting water.

In cases where a method of feeding the polishing slurry separated into two or more components to the surface to be polished is applied in the invention, the amount of the polishing slurry corresponds to the sum of the amounts of feeding from the respective lines.

The polishing slurry is preferably fed at a rate of 10 to 1,000 ml/min. To achieve satisfactory uniformity of the polishing rate across the object surface to be polished and adequate pattern planarity, a feed rate of 50 to 800 ml/min is more preferred. Preferably, the polishing slurry is continuously fed to the polishing pad with a pump during the polishing. While the amount of polishing slurry fed to the polishing pad is not limited, it is preferable that the surface of the polishing pad be steadily covered with the polishing slurry.

[Polishing Pad]

The polishing pad that may be applied to the polishing method of the invention may be a pad having an unexpanded structure or a pad having an expanded structure. In pads having an unexpanded structure, a hard synthetic resin bulk material such as a plastic plate is used as the pad. There are three general types of pads having an expanded structure: those made of closed-cell foam (dry expanded), those made of open-cell foam (wet expanded), and those made of two-layer composites (laminated). Of these, pads made of two-layer composites (laminated) are especially preferred. Expansion may be uniform or non-uniform.

In addition, the polishing pad may contain an abrasive generally used in polishing (for example, ceria, silica, alumina, or resin). The polishing pad may be of a soft or hard nature. In a laminated polishing pad, it is preferable to have the layers made of materials of different hardnesses. Preferred materials for the polishing pad include nonwoven fabric, synthetic leather, polyamide, polyurethane, polyester and polycarbonate. The surface of the polishing pad which comes into contact with the surface to be polished may be shaped so as to form thereon, for example, grooves arranged as a grid, holes, concentric grooves, or spiral grooves.

[Wafer]

The wafer which is an object to be subjected to CMP with the polishing slurry of the invention preferably has a diameter of at least 200 mm and more preferably at least 300 mm. The effects of the invention are significantly exhibited at a diameter of at least 300 mm.

[Polishing Apparatus]

The apparatus with which polishing can be carried out using the polishing slurry of the invention is not particularly limited, and examples thereof include Mirra Mesa CMP, Reflexion CMP (Applied Materials, Inc.), FREX200, FREX300 (Ebara Corporation), NPS3301, NPS2301 (Nikon Corporation), A-FP-310A, A-FP-210A (Tokyo Seimitus Co., Ltd.), 2300 TERES (Lam Research Corporation), and Momentum (SpeedFam-IPEC, Inc.).

As described above, the polishing slurry of the invention achieves a good polishing rate on various films to be polished (e.g., barrier layer) while controlling the polishing rate on various films to be polished. What is more, excellent long-term storage stability is achieved with minimized agglomeration of polishing abrasive particles. By particularly using the inclusion compound in the component of the invention, agglomeration of polishing abrasive particles is suppressed to improve the storage stability while minimizing the occurrence of scratches due to the polishing. Although the reason is not clear, this is presumably because the inclusion compound traps a di-quaternary ammonium cation compound (optional ingredient) or a surfactant such as an anionic surfactant to suppress the agglomeration of solid abrasive particles which may probably cause scratches.

EXAMPLES

The invention is described below in further detail by way of examples. However, the invention should not be construed as being limited to the following examples.

Example 1

A polishing slurry of the composition indicated below was prepared and a polishing experiment was conducted.

[Composition (1)]

| | |
|---|---|
| Abrasive: colloidal silica (PL-3 from Fuso Chemical Co., Ltd.) (Secondary particle size: 65 nm; silica concentration: 20 wt %) | 300 g/L |
| Anticorrosive: benzotriazole (BTA) | 2.0 g/L |
| Acid: diglycolic acid | 1 g/L |
| Surfactant: dodecylbenzenesulfonic acid | 0.01 g/L |
| Inclusion compound: β-cyclodextrin | 0.5 g/L |
| Di-quaternary ammonium salt: Di-quaternary cation A1 (anion: nitrate ion) | 2.0 g/L |
| Oxidizer: hydrogen peroxide solution (hydrogen peroxide concentration: 30 wt %) | 35 mL |
| Pure water added to a total volume of 1000 mL | |
| pH (adjusted with ammonia water and nitric acid) | 3.5 |

[Evaluation Method]

A polishing apparatus F-REX 300 manufactured by Ebara Corporation was used to polish each of the wafer films described below under the following conditions while feeding a slurry.

Table speed: 90 rpm
Head speed: 85 rpm
Polishing pressure: 14.0 kPa
Polishing pad: IC1400-XY-k Groove (manufactured by Rodel)
Feed rate of the polishing slurry: 300 ml/min

[Evaluation of Polishing Rate: Object to be Polished]

The object to be polished for use in the evaluation of the polishing rate to be described below was a 12-inch wafer obtained by forming a Ta film, a TEOS film and a SiOC film on a silicon substrate.

[Evaluation of Scratch Resistance: Object to be Polished]

A TEOS (tetraethoxysilane) film in a wafer was patterned by a photolithographic step and a reactive ion etching step to form wiring grooves with a width of 0.09 to 100 μm and a depth of 600 nm and connecting holes, and a Ta film with a thickness of 20 nm was further formed by sputtering. Subsequently, a copper film with a thickness of 50 nm was formed by sputtering, which was followed by plating to a total copper film thickness of 1000 nm. The thus obtained 12-inch wafer was used as an object to be polished.

[Polishing Rate]

The thicknesses of the Ta film (barrier layer), the TEOS film, and the SiOC film (insulating film) before and after CMP were measured, respectively, and the polishing rates were calculated from the following expression:

Polishing rate (Å/min)=(thickness of film to be polished−thickness of polished film)/polishing time The results obtained are shown in Table 1.

[Evaluation of Scratch Resistance]

The object for use in evaluating the scratch resistance was polished to the TEOS film of the wafer (a 50 nm thick portion of the TEOS film was polished). Then, the polished surface was rinsed with pure water and dried. After drying, the polished surface was observed with an optical microscope and evaluated for the scratch resistance based on the following evaluation criteria. Good and fair are regarded as levels at which there is no practical problem.

-Evaluation Criteria-

Good: Major scratches were not observed.

Fair: One or two major scratches were observed on the wafer surface.

NG: A large number of major scratches were observed on the wafer surface.

Examples 2 to 32 and Comparative Examples 1 to 3

Composition (1) in Example 1 was replaced by the compositions shown in Table 1 to prepare polishing slurries, which were used to conduct polishing experiments under the same polishing conditions as in Example 1. The results are shown in Table 1. The anion of the di-quaternary ammonium salts (di-quaternary cations A-1 to A-32) used in Table 1 is nitrate ion. The hydrogen peroxide solution used in Table 1 had a hydrogen peroxide concentration of 30 wt %.

TABLE 1

| | Polishing slurry | | | | | |
|---|---|---|---|---|---|---|
| | Abrasive (g/L) | Anti-Corrosive (g/L) | Acid (g/L) | Surfactant (g/L) | Inclusion compound (g/L) | Di-quaternary cation (g/L) |
| EX 1 | Colloidal silica (PL-3: 20 wt %) 300 g/L | BTA 2.0 g/L | Diglycolic acid 1 g/L | Dodecylbenzene-Sulfonic acid 0.01 g/L | β-Cyclodextrin 0.5 g/L | A1 0.2 g/L |
| EX 2 | Colloidal silica (PL-3H: 20 wt %) 250 g/L | BTA 1.0 g/L | Glycine 0.5 g/L | Alkyl diphenyl ether disulfonic acid 0.18 g/L | γ-Cyclodextrin 1 g/L | A2 1.1 g/L |
| EX 3 | Colloidal silica (PL-2: 20 wt %) 380 g/L | DBTA 3.2 g/L | N-Methyl-glycine 2.2 g/L | Dodecylnaphthalenesulfonic acid 0.6 g/L | γ-Cyclodextrin 0.8 g/L | A3 0.3 g/L |
| EX 4 | Fumed silica (particle size: 65 nm) 158 g/L | DCEBTA 2.1 g/L | Glycolic acid 1.9 g/L | Dodecylbenzene-sulfonic acid 1.2 g/L | β-Cyclodextrin 0.7 g/L | A4 0.25 g/L |
| EX 5 | Colloidal silica (PL-3L: 20 wt %) 280 g/L | HMBTA 1.2 g/L | Diglycolic acid 0.4 g/L | Dodecyl-pyridinium nitrate 0.1 g/L | α-Cyclodextrin 0.1 g/L | A5 0.1 g/L |
| EX 6 | Alumina (particle size: 60 nm) 139 g/L | BTA 2.2 g/L | Methoxy-acetic acid 1.7 g/L | Lauryltrimethyl-ammonium nitrate 0.08 g/L | β-Cyclodextrin 0.03 g/L | A6 0.2 g/L |
| EX 7 | Ceric oxide (particle size: 55 nm) 200 g/L | HEABTA 0.9 g/L | Glycine 1.4 g/L | Alkyl diphenyl ether disulfonic acid 1.1 g/L | β-Cyclodextrin 1.2 g/L | A7 1.3 g/L |
| EX 8 | Colloidal silica (PL-3H: 20 wt %) 234 g/L | 1H-Tetrazole 5.2 g/L | Diglycolic acid 0.2 g/L | Dodecylbenzene-sulfonic acid 0.01 g/L | β-Cyclodextrin 1.1 g/L | A8 0.4 g/L |
| EX 9 | Colloidal silica (PL-3: 20 wt %) 149 g/L | 1,2,3-Triazole 3.2 g/L | N-Methyl-glycine 2.4 g/L | Dodecylnaphthalenesulfonic acid 1.2 g/L | β-Cyclodextrin 0.5 g/L | A9 0.9 g/L |
| EX 10 | Colloidal silica (PL-3L: 20 wt %) 198 g/L | BTA 1.5 g/L | Diglycolic acid 0.7 g/L | Dodecylbenzene-sulfonic acid 0.02 g/L | β-Cyclodextrin 0.4 g/L | A10 0.4 g/L |
| EX 11 | Colloidal silica (PL-3: 20 wt %) 200 g/L | BTA 0.9 g/L | Diglycolic acid 1.3 g/L | Dodecylbenzene-sulfonic acid 0.01 g/L | β-Cyclodextrin 1.5 g/L | A11 0.3 g/L |
| EX 12 | Colloidal silica (PL-3H: 20 wt %) 212 g/L | BTA 0.7 g/L | N-Methyl-glycine 0.4 g/L | Dodecylbenzene-sulfonic acid 0.28 g/L | β-Cyclodextrin 1.5 g/L | A12 0.3 g/L |
| EX 13 | Colloidal silica (PL-2: 20 wt %) 311 g/L | DBTA 0.1 g/L | N-Methyl-glycine 2.2 g/L | Dodecylnaphthalenesulfonic acid 0.6 g/L | γ-Cyclodextrin 0.8 g/L | A13 0.3 g/L |
| EX 14 | Colloidal silica (PL-3: 20 wt %) 218 g/L | DCEBTA 2.8 g/L | Diglycolic acid 1.9 g/L | Dodecylbenzene-sulfonic acid 1.2 g/L | β-Cyclodextrin 0.7 g/L | A14 0.25 g/L |
| EX 15 | Colloidal silica (PL-3L: 20 wt %) 324 g/L | HMBTA 1.7 g/L | Diglycolic acid 0.4 g/L | Dodecyl-pyridinium nitrate 0.1 g/L | α-Cyclodextrin 0.1 g/L | A15 0.3 g/L |

TABLE 1-continued

| | | | | | | |
|---|---|---|---|---|---|---|
| EX 16 | Fumed silica (particle size: 60 nm) 339 g/L | BTA 2.1 g/L | Methoxy-acetic acid 1.7 g/L | Lauryltrimethyl-ammonium nitrate 0.18 g/L | β-Cyclo-dextrin 0.03 g/L | A16 0.2 g/L |
| EX 17 | Colloidal silica (PL-2: 20 wt %) 205 g/L | HEABTA 1.9 g/L | 2,5-Furan-dicarboxylic acid 1.4 g/L | Alkyl diphenyl ether disulfonic acid 1.4 g/L | α-Cyclo-dextrin 1.4 g/L | A17 2.3 g/L |
| EX 18 | Colloidal silica (PL-3H: 20 wt %) 134 g/L | BTA 7.3 g/L | Diglycolic acid 0.2 g/L | Dodecylnaphthalenesulfonic acid 0.01 g/L | β-Cyclo-dextrin 1.1 g/L | A18 0.4 g/L |
| EX 19 | Colloidal silica (PL-3: 20 wt %) 249 g/L | HMBTA 3.3 g/L | 2-Tetra-hydrofuran-carboxylic acid 2.4 g/L | Dodecylnaphthalenesulfonic acid 1.2 g/L | β-Cyclo-dextrin 0.5 g/L | A19 0.7 g/L |
| EX 20 | Colloidal silica (PL-3L: 20 wt %) 188 g/L | BTA 1.2 g/L | α-Alanine 0.7 g/L | Alkyl diphenyl ether disulfonic acid 0.32 g/L | β-Cyclo-dextrin 0.4 g/L | A20 0.4 g/L |
| EX 21 | Colloidal silica (PL-3L: 20 wt %) 255 g/L | DCEBTA 1.9 g/L | Diglycolic acid 0.3 g/L | Dodecylbenzene-sulfonic acid 0.05 g/L | β-Cyclo-dextrin 1.1 g/L | A21 0.3 g/L |
| EX 22 | Colloidal silica (PL-3L: 20 wt %) 250 g/L | BTA 7.0 g/L | N-Methyl-glycine 0.8 g/L | Dodecylbenzene-sulfonic acid 0.08 g/L | β-Cyclo-dextrin 0.01 g/L | A22 0.12 g/L |
| EX 23 | Colloidal silica (PL-2L: 20 wt %) 311 g/L | BTA 2.1 g/L | N-Methyl glycine 2.1 g/L | Dodecylnaphthalenesulfonic acid 0.16 g/L | α-Cyclo-dextrin 0.2 g/L | A23 0.3 g/L |
| EX 24 | Colloidal silica (PL-3: 20 wt %) 240 g/L | DCEBTA 2.4 g/L | Diglycolic acid 2.9 g/L | Dodecylbenzene-sulfonic acid 1.1 g/L | β-Cyclo-dextrin 0.4 g/L | A24 0.25 g/L |
| EX 25 | Colloidal silica (PL-3: 20 wt %) 320 g/L | HMBTA 1.8 g/L | Diglycolic acid 0.7 g/L | Dodecylbenzene-sulfonic acid 0.11 g/L | α-Cyclo-dextrin 0.12 g/L | A25 0.3 g/L |
| EX 26 | Colloidal silica (PL-3L: 20 wt %) 239 g/L | BTA 2.9 g/L | Diglycolic acid 1.2 g/L | Alkyl diphenyl ether disulfonic acid 0.12 g/L | β-Cyclo-dextrin 0.03 g/L | A26 0.22 g/L |
| EX 27 | Colloidal silica (PL-3: 20 wt %) 225 g/L | HEABTA 5.9 g/L | 2,5-Furan-dicarboxylic acid 0.4 g/L | Alkyl diphenyl ether disulfonic acid 1.1 g/L | β-Cyclo-dextrin 1.1 g/L | A27 0.11 g/L |
| EX 28 | Colloidal silica (PL-3: 20 wt %) 184 g/L | BTA 3.8 g/L | Diglycolic acid 0.1 g/L | Dodecylnaphthalenesulfonic acid 0.06 g/L | β-Cyclo-dextrin 1.2 g/L | A28 0.04 g/L |
| EX 29 | Colloidal silica (PL-3H: 20 wt %) 242 g/L | BTA 1.3 g/L | Glycolic acid 0.4 g/L | Dodecylnaphthalenesulfonic acid 1.06 g/L | β-Cyclo-dextrin 0.15 g/L | A29 0.71 g/L |
| EX 30 | Colloidal silica (PL-3: 20 wt %) 388 g/L | BTA 1.9 g/L | Glycine 0.01 g/L | Alkyl diphenyl ether disulfonic acid 0.08 g/L | γ-Cyclo-dextrin 0.24 g/L | A30 0.4 g/L |
| EX 31 | Colloidal silica (PL-3L: 20 wt %) 300 g/L | BTA 3.1 g/L | Diglycolic acid 1.5 g/L | Alkyl diphenyl ether disulfonic acid 0.02 g/L | β-Cyclo-dextrin 0.03 g/L | A31 0.2 g/L |
| EX 32 | Colloidal silica (PL-3: 20 wt %) 250 g/L | BTA 1.5 g/L | Diglycolic acid 2.5 g/L | Alkyl diphenyl ether disulfonic acid 0.002 g/L | β-Cyclo-dextrin 0.001 g/L | A32 0.15 g/L |
| CE 1 | Colloidal silica (PL-3: 20 wt %) 200 g/L | BTA 3.8 g/L | Diglycolic acid 0.1 g/L | Dodecylbenzene-sulfonic acid 0.06 g/L | — | A1 0.04 g/L |
| CE 2 | Colloidal silica (PL-3: 20 wt %) 200 g/L | BTA 3.8 g/L | Diglycolic acid 0.1 g/L | — | β-Cyclo-dextrin 0.15 g/L | A1 0.71 g/L |

TABLE 1-continued

| | | | | | | |
|---|---|---|---|---|---|---|
| CE 3 | Colloidal silica (PL-3: 20 wt %) 200 g/L | BTA 1.9 g/L | Diglycolic acid 0.1 g/L | Dodecylnaphthalenesulfonic acid 0.06 g/L | — | A1 0.4 g/L |

| | Polishing slurry | | Evaluation result | | | |
|---|---|---|---|---|---|---|
| | | | Ta polishing rate | TEOS polishing rate | SiOC polishing rate | Scratch |
| | Oxidizer | pH | (Å/min) | (Å/min) | (Å/min) | resistance |
| EX 1 | Hydrogen peroxide (30 wt %) 35 ml | 3.5 | 800 | 1000 | 350 | Good |
| EX 2 | Hydrogen peroxide (30 wt %) 20 ml | 3.7 | 650 | 980 | 420 | Good |
| EX 3 | Ammonium persulfate 2 g/L | 3.5 | 700 | 1200 | 280 | Good |
| EX 4 | Hydrogen peroxide (30 wt %) 50 ml | 3.8 | 660 | 650 | 600 | Good |
| EX 5 | Hydrogen peroxide (30 wt %) 40 ml | 3.5 | 500 | 870 | 220 | Good |
| EX 6 | Hydrogen peroxide (30 wt %) 35 ml | 3.6 | 600 | 700 | 300 | Fair |
| EX 7 | Hydrogen peroxide (30 wt %) 20 ml | 3.5 | 750 | 700 | 230 | Fair |
| EX 8 | Hydrogen peroxide (30 wt %) 20 ml | 3.5 | 800 | 900 | 370 | Good |
| EX 9 | Ammonium persulfate 1.5 g/L | 3.7 | 750 | 740 | 240 | Good |
| EX 10 | Hydrogen peroxide (30 wt %) 20 ml | 3.5 | 680 | 680 | 420 | Good |
| EX 11 | Hydrogen peroxide (30 wt %) 45 ml | 3.5 | 520 | 540 | 220 | Good |
| EX 12 | Hydrogen peroxide (30 wt %) 15 ml | 3.5 | 540 | 600 | 250 | Good |
| EX 13 | Ammonium persulfate 2 g/L | 3.5 | 800 | 900 | 450 | Good |
| EX 14 | Hydrogen peroxide (30 wt %) 15 ml | 3.5 | 400 | 700 | 500 | Good |
| EX 15 | Hydrogen peroxide (30 wt %) 25 ml | 3.5 | 520 | 600 | 350 | Good |
| EX 16 | Hydrogen peroxide (30 wt %) 40 ml | 3.5 | 600 | 550 | 290 | Good |
| EX 17 | Hydrogen peroxide (30 wt %) 20 ml | 3.5 | 400 | 750 | 220 | Good |
| EX 18 | Potassium persulfate | 3.5 | 750 | 900 | 410 | Good |

TABLE 1-continued

| | | | | | | | |
|---|---|---|---|---|---|---|---|
| EX 19 | Ammonium persulfate 1 g/L | | 3.4 | 670 | 710 | 310 | Good |
| EX 20 | Hydrogen peroxide (30 wt %) 1.5 g/L | | 3.5 | 630 | 540 | 320 | Good |
| EX 21 | Ammonium persulfate 10 ml | | 2.9 | 560 | 640 | 190 | Good |
| EX 22 | Hydrogen peroxide (30 wt %) 2.5 g/L | | 3.6 | 550 | 650 | 340 | Good |
| EX 23 | Ammonium persulfate 60 ml | | 3.5 | 920 | 920 | 220 | Good |
| EX 24 | Hydrogen peroxide (30 wt %) 2.5 g/L | | 3.1 | 890 | 720 | 310 | Good |
| EX 25 | Hydrogen peroxide (30 wt %) 25 ml | | 4.4 | 580 | 630 | 300 | Good |
| EX 26 | Hydrogen peroxide (30 wt %) 30 ml | | 4.9 | 720 | 580 | 280 | Good |
| EX 27 | Hydrogen peroxide (30 wt %) 16 ml | | 3.5 | 490 | 440 | 190 | Good |
| EX 28 | Ammonium persulfate 13 ml | | 3.5 | 750 | 800 | 420 | Good |
| EX 29 | Ammonium persulfate 1 g/L | | 4.3 | 660 | 650 | 310 | Good |
| EX 30 | Hydrogen peroxide (30 wt %) 1.5 g/L | | 3.5 | 550 | 570 | 330 | Good |
| EX 31 | Hydrogen peroxide (30 wt %) 30 ml | | 3.5 | 600 | 550 | 240 | Good |
| EX 32 | Hydrogen peroxide (30 wt %) 16 ml | | 3.5 | 550 | 450 | 630 | Good |
| CE 1 | Ammonium persulfate 13 ml | | 3.5 | 300 | 400 | 440 | NG |
| CE 2 | Ammonium persulfate 1 g/L | | 4.3 | 35 | 25 | 20 | Fair |
| CE 3 | Hydrogen peroxide (30 wt %) 1.5 g/L 30 ml | | 3.5 | 350 | 570 | 330 | NG |

The numbers in the column of di-quaternary cation shown in Table 1 correspond to specific examples A-1 to A-32 of the di-quaternary ammonium cation moiety in the di-quaternary ammonium salt.

The compounds abbreviated in Table 1 are shown in detail below.

[Anticorrosive]
BTA: 1,2,3-benzotriazole
DBTA: 5,6-dimethyl-1,2,3-benzotriazole
DCEBTA: 1-(1,2-dicarboxyethyl)benzotriazole
HEABTA: 1-[N,N-bis(hydroxyethyl)aminomethyl]benzotriazole
HMBTA: 1-(hydroxymethyl)benzotriazole The primary particle sizes of the colloidal silicas shown in Table 1 are described below. The colloidal silicas of the invention are all available from Fuso Chemical Co., Ltd. In Table 1, "20 wt %" refers to a colloidal silica concentration in the following products: PL-3, PL-3L, PL-3H, PL-2 and PL-2L.

PL-3: Primary particle size: 35 nm; association degree: 2
PL-3L: Primary particle size: 35 nm; spherical shape PL-3H: Primary particle size: 35 nm; association degree: 3 PL-2: Primary particle size: 25 nm; association degree: 2 PL-2L: Primary particle size: 25 nm; spherical shape Table 1 shows that, compared with Comparative Examples 1 to 3, good polishing rates on various films to be polished as well as excellent scratch resistance were achieved in cases where the polishing slurries in Examples 1 to 32 were used.

On the other hand, the polishing slurry in Comparative Example 2 was inferior in the polishing rate of the SiOC film although the problem on the scratch resistance was relatively small. It was revealed that the polishing slurries in Comparative Examples 1 and 3 were low in the polishing rate of the Ta and TEOS films and the scratch resistance was also not satisfactory. It was revealed that, in cases where the inclusion compound and the surfactant were not used in combination, the scratch resistance was inferior although the polishing rate of the SiOC film was only relatively good. This is presumably because of the agglomeration and precipitation occurring during storage, which will be described later.

From the above, it was revealed that the polishing slurry of the invention achieved a good polishing rate not only on the Ta film but also on the TEOS and SiOC films and also exhibited excellent scratch resistance.

Examples 33 to 35

Polishing slurry A (adjusted to a pH of 3.5) containing no dodecylbenzenesulfonic acid or β-cyclodextrin which were both included in Example 1 and 1000 mL of Solution B (adjusted to a pH of 3.5) containing 0.1 g/L of dodecylbenzenesulfonic acid and 5 g/L of β-cyclodextrin dissolved in pure water as a solvent were prepared. Table 2 shows that the polishing rate of the SiOC film can be controlled as desired by mixing Polishing slurry A and Solution B at arbitrary ratios.

TABLE 2

| Polishing slurry | | | Evaluation result | | | |
|---|---|---|---|---|---|---|
| Polishing slurry A | Solution B | pH | Ta polishing rate (Å/min) | TEOS polishing rate (Å/min) | SiOC polishing rate (Å/min) | Scratch resistance |
| EX 33 | 1 L | 10 ml | 3.5 | 800 | 1000 | 45 | Good |
| EX 34 | 1 L | 300 ml | 3.5 | 800 | 1000 | 450 | Good |
| EX 35 | 1 L | 600 ml | 3.5 | 800 | 1000 | 600 | Good |

[Comparison of Storage Stability]

Examples 36 to 67 (Examples 1 to 32) and Comparative Examples 4 to 6 (Comparative Examples 1 to 3)

The polishing slurries in Examples 1 to 32 and Comparative Examples 1 to 3 were used to evaluate the storage stability according to the following procedure: The prepared polishing slurry was put in a test tube and allowed to stand in an environment of 25° C. and a humidity of 60%; the polishing slurry immediately after preparation, and 1 day, 7 days, 30 days and 90 days after preparation were visually checked for the presence of agglomeration and precipitation.

Evaluation was made at three levels: the slurry was rated "good" when no agglomeration or precipitation was confirmed, "fair" when agglomeration and/or precipitation could be confirmed but returned to the original state by agitation, and "NG" when agglomeration and/or precipitation occurred and did not return to the original state by agitation. The evaluation results are shown in Table 3.

TABLE 3

| Example No. | Type of polishing slurry used | Storage stability (whether there is agglomeration or precipitation) | | | | |
|---|---|---|---|---|---|---|
| | | Just after preparation | Day 1 | Day 7 | Day 30 | Day 90 |
| EX 36 | Polishing slurry in Example 1 | Good | Good | Good | Good | Good |
| EX 37 | Polishing slurry in Example 2 | Good | Good | Good | Good | Good |
| EX 38 | Polishing slurry in Example 3 | Good | Good | Good | Good | Good |
| EX 39 | Polishing slurry in Example 4 | Good | Good | Good | Good | Good |
| EX 40 | Polishing slurry in Example 5 | Good | Good | Good | Good | Good |
| EX 41 | Polishing slurry in Example 6 | Good | Good | Good | Good | Fair |
| EX 42 | Polishing slurry in Example 7 | Good | Good | Good | Good | Fair |
| EX 43 | Polishing slurry in Example 8 | Good | Good | Good | Good | Good |
| EX 44 | Polishing slurry in Example 9 | Good | Good | Good | Good | Good |
| EX 45 | Polishing slurry in Example 10 | Good | Good | Good | Good | Good |
| EX 46 | Polishing slurry in Example 11 | Good | Good | Good | Good | Good |
| EX 47 | Polishing slurry in Example 12 | Good | Good | Good | Good | Good |
| EX 48 | Polishing slurry in Example 13 | Good | Good | Good | Good | Good |
| EX 49 | Polishing slurry in Example 14 | Good | Good | Good | Good | Good |
| EX 50 | Polishing slurry in Example 15 | Good | Good | Good | Good | Good |
| EX 51 | Polishing slurry in Example 16 | Good | Good | Good | Good | Good |
| EX 52 | Polishing slurry in Example 17 | Good | Good | Good | Good | Good |
| EX 53 | Polishing slurry in Example 18 | Good | Good | Good | Good | Good |
| EX 54 | Polishing slurry in Example 19 | Good | Good | Good | Good | Good |
| EX 55 | Polishing slurry in Example 20 | Good | Good | Good | Good | Good |
| EX 56 | Polishing slurry in Example 21 | Good | Good | Good | Good | Good |
| EX 57 | Polishing slurry in Example 22 | Good | Good | Good | Good | Good |
| EX 58 | Polishing slurry in Example 23 | Good | Good | Good | Good | Good |
| EX 59 | Polishing slurry in Example 24 | Good | Good | Good | Good | Good |
| EX 60 | Polishing slurry in Example 25 | Good | Good | Good | Good | Good |
| EX 61 | Polishing slurry in Example 26 | Good | Good | Good | Good | Good |
| EX 62 | Polishing slurry in Example 27 | Good | Good | Good | Good | Good |
| EX 63 | Polishing slurry in Example 28 | Good | Good | Good | Good | Good |
| EX 64 | Polishing slurry in Example 29 | Good | Good | Good | Good | Good |
| EX 65 | Polishing slurry in Example 30 | Good | Good | Good | Good | Good |
| EX 66 | Polishing slurry in Example 31 | Good | Good | Good | Good | Good |
| EX 67 | Polishing slurry in Example 32 | Good | Good | Good | Good | Good |
| CE 4 | Polishing slurry in Comparative Example 1 | Good | Fair | NG | NG | NG |
| CE 5 | Polishing slurry in Comparative Example 2 | Good | Good | Fair | Fair | NG |

TABLE 3-continued

| Example No. | Type of polishing slurry used | Storage stability (whether there is agglomeration or precipitation) | | | | |
|---|---|---|---|---|---|---|
| | | Just after preparation | Day 1 | Day 7 | Day 30 | Day 90 |
| CE 6 | Polishing slurry in Comparative Example 3 | NG | NG | NG | NG | NG |

Table 3 revealed that the polishing slurry of the invention causes no agglomeration or precipitation for a long term while exhibiting excellent storage stability. In the polishing slurries in Examples 1 to 32 of the invention, there was no change in the polishing rate on each type of film, nor did scratches occur. On the other hand, in the polishing slurries in Comparative Examples, agglomeration and/or precipitation occurred and did not return to the original state by agitation, and a reduced polishing rate and increased scratches were also confirmed. From the above, it was revealed that the polishing slurry of the invention is excellent in the polishing rate, scratch resistance and storage stability.

What is claimed is:

1. A polishing slurry used in chemical mechanical polishing of a barrier layer and an interlayer dielectric film in a semiconductor integrated circuit, the polishing slurry comprising:
an abrasive;
an oxidizer;
an anticorrosive;
an acid;
a surfactant;
an inclusion compound; and
a di-quaternary ammonium salt,
wherein the polishing slurry has a pH of less than 5, and
wherein the di-quaternary ammonium salt is an ammonium salt represented by the general formula (2):

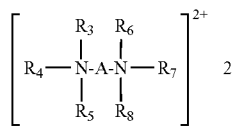

General formula (2)

wherein $R_3$ to $R_8$ each independently represent an alkyl group, an alkenyl group, a cycloalkyl group, an aryl group or an aralkyl group; two of $R_3$ to $R_8$ may be bonded together to form a ring; A represents an alkylene group, a cycloalkylene group, an arylene group or a combination thereof; $X^-$ represents a nitrate ion.

2. The polishing slurry according to claim 1, wherein the inclusion compound is a cyclodextrin.

3. The polishing slurry according to claim 1, wherein the acid is a carboxyl group-containing organic acid.

4. The polishing slurry according to claim 1, wherein the acid is an organic acid containing two or more carboxyl groups.

5. The polishing slurry according to claim 3, wherein the organic acid is a compound represented by the general formula (1):

$R_1-O-R_2-COOH$     General formula (1)

wherein $R_1$ and $R_2$ each independently represent a hydrocarbon group or an oxygen-containing hydrocarbon group, provided that $R_1$ and $R_2$ may be bonded together to form a cyclic structure.

6. The polishing slurry according to claim 1, wherein the surfactant is an anionic surfactant.

7. The polishing slurry according to claim 2, wherein the cyclodextrin is β-cyclodextrin.

8. The polishing slurry according to claim 1, wherein the polishing slurry is obtained by mixing a solution A containing the abrasive, the anticorrosive, the acid and the di-quaternary ammonium salt, and a solution B containing the surfactant and the inclusion compound.

9. The polishing slurry according to claim 1, wherein the abrasive is silica.

10. A polishing slurry used in chemical mechanical polishing of a barrier layer and an interlayer dielectric film in a semiconductor integrated circuit, the polishing slurring consisting essentially of:
at least one abrasive;
at least one oxidizer;
at least one anticorrosive;
at least one acid;
at least one surfactant;
at least one inclusion compound;
at least one di-quaternary ammonium salt; and
water,
wherein the polishing slurry has a pH less than 5, and
wherein the di-quaternary ammonium salt is an ammonium salt represented by the general formula (2):

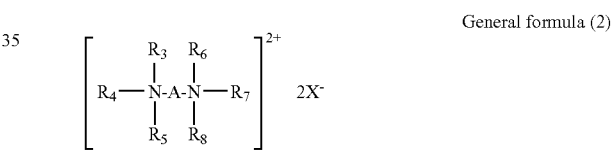

General formula (2)

wherein $R_3$ to $R_8$ each independently represent an alkyl group, an alkenyl group, a cycloalkyl group, an aryl group or an aralkyl group; two of $R_3$ to $R_8$ may be bonded together to form a ring; A represents an alkylene group, a cycloalkylene group, an arylene group or a combination thereof; $X^-$ represents a nitrate ion.

11. The polishing slurry according to claim 10, wherein the inclusion compound is a clyclodextrin.

12. The polishing slurry according to claim 10, wherein the acid is a carboxyl group-containing organic acid.

13. A method of chemical mechanical polishing comprising the steps of:
feeding a polishing slurry, which is used in chemical mechanical polishing of a barrier layer and an interlayer dielectric film in a semiconductor integrated circuit, to a polishing pad, the polishing slurry comprising:
an abrasive;
an oxidizer;
an anticorrosive;
an acid;
a surfactant;
an inclusion compound; and
a di-quaternary ammonium salt,
wherein the polishing slurry has a pH of less than 5, and
wherein the di-quaternary ammonium salt is an ammonium salt represented by the general formula (2):

General formula (2)

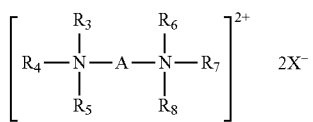

wherein $R_3$ to $R_8$ each independently represent an alkyl group, an alkenyl group, a cycloalkyl group, an aryl group or an aralkyl group; two of $R_3$ to $R_8$ may be bonded together to form a ring; A represents an alkylene group, a cycloalkylene group, an arylene group or a combination thereof; $X^-$ represents a nitrate ion;

bringing the polishing pad into contact with a surface of an object to be polished; and polishing the surface while moving the polishing pad and the object relative to each other.

* * * * *